United States Patent [19]

Zhao et al.

[11] Patent Number: 5,643,364
[45] Date of Patent: Jul. 1, 1997

[54] PLASMA CHAMBER WITH FIXED RF MATCHING

[75] Inventors: Jun Zhao, Milpitas; Stefan Wolff; Kenneth Smyth, both of Sunnyvale; William Nixon Taylor, Jr., Dublin; Gerald McNutt, Los Altos Hills, all of Calif.

[73] Assignee: Applied Materials, Inc., Santa Clara, Calif.

[21] Appl. No.: 641,948

[22] Filed: May 2, 1996

Related U.S. Application Data

[63] Continuation of Ser. No. 348,352, Nov. 30, 1994.

[51] Int. Cl.$^6$ .................................................. C23C 16/00
[52] U.S. Cl. .................... 118/723 E; 118/723 ER; 118/723 I
[58] Field of Search ............... 118/723 E, 723 ER, 118/723 MP, 723 I, 723 IR; 156/345; 204/298.08, 298.34; 313/231.31; 315/111.21

[56] References Cited

U.S. PATENT DOCUMENTS

| | | | |
|---|---|---|---|
| 3,860,507 | 1/1975 | Vossen, Jr. ................... | 204/192 |
| 4,557,819 | 12/1985 | Meacham et al. ............. | 204/298 |
| 4,824,546 | 4/1989 | Ohmi ............................ | 204/298 |
| 5,108,569 | 4/1992 | Giboa et al. .................. | 204/192.13 |
| 5,140,223 | 8/1992 | Gesche et al. ................ | 315/111.21 |
| 5,147,493 | 9/1992 | Nichimura et al. ........... | 156/345 |
| 5,241,152 | 8/1993 | Anderson et al. ............. | 219/121.57 |
| 5,288,971 | 2/1994 | Knipp ........................... | 219/121.57 |
| 5,473,291 | 12/1995 | Brounley ...................... | 333/17.3 |
| 5,478,429 | 12/1995 | Komino et al. ............... | 156/345 |

FOREIGN PATENT DOCUMENTS

| | | |
|---|---|---|
| 0058820 | 9/1982 | European Pat. Off. . |
| 0451514 | 10/1991 | European Pat. Off. . |
| 4037698 | 8/1991 | Germany . |
| 58-073848 | 7/1983 | Japan . |

OTHER PUBLICATIONS

Radio Frequency Transitiors: Principles and Practical Applications, Norm Dye and Helge Granberg, pp. 116–123.
Reflections: Transmission Lines and Antennas, M. Walter Maxwell, pp. 14–1–14–17, Newington, Connecticut.

*Primary Examiner*—John Niebling
*Assistant Examiner*—Joni Y. Chang
*Attorney, Agent, or Firm*—Michaelson & Wallace

[57] ABSTRACT

A plasma chamber RF excitation system includes a high frequency RF power source having a fixed RF match circuit at its output and sensing and control apparatus for sensing the amount of RF power delivered by the RF power source and for regulating the output power level of the RF power source so as to maintain the RF power delivered by the RF power source at a desired level, and an RF plasma chamber including an RF radiator. The power source is mounted proximate or directly on the plasma chamber so that the distance between them is much less than an eighth of a wavelength at thr frequency of the RF source. The system may further include an endpoint detector for a plasma etch process or a chamber cleaning process which halts the process when the VSWR or reflected power ceases to change in response to the progress of the etch process.

17 Claims, 4 Drawing Sheets

PLASMA CHAMBER WITH FIXED RF MATCHING

This is a continuation of application Ser. No. 08/348,352, filed Nov. 30, 1994.

BACKGROUND OF THE INVENTION

1. Technical Field

The invention is related to high frequency capacitively coupled radio frequency (RF) plasma reactors for semiconductor wafers and in particular to improvements in the control of the RF source power level and to protection of the wafer pedestal from damage during chamber cleaning operations.

2. Background Art

Referring to FIG. 1A, a plasma chamber 10 operating at a high RF frequency (e.g., 13.56 MHz) holds a semiconductor wafer or substrate (not shown) and performs a desired process on the wafer, such as plasma etching, plasma-enhanced chemical vapor deposition, or sputtering. In order to maintain a plasma within the chamber 10, RF power is furnished to the chamber 10 by a conventional 13.56 MHz RF generator 12 via a transmission line 14 (such as a 50 ohm coaxial cable) and a variable RF match circuit 16. The conventional RF generator 12 includes a 13.56 MHz RF power source 12a, an output stage 12b, and a conventional dual directional coupler 12c. The output stage 12b matches the non-standard output impedance of the RF power circuit 12a to the industry standard characteristic impedance of the coaxial cable of 50 ohms. The dual directional coupler 12c provides outputs 18a, 18b indicative of the forward and reflected R.F power at the output of the output stage 12b. A conventional feedback control circuit 20 governs the variable RF match circuit in such a manner as to minimize the VSWR, that is, to minimize the reflected RF power sensed at the reflected power output 18b of the dual directional coupler. Specifically, the control circuit adjusts the variable RF match network so as to transform the impedance of the plasma chamber to the 50 ohm characteristic impedance of the coaxial cable. Since the plasma chamber impedance tends to vary during wafer processing, the variable RF match circuit 16 maintains an RF match by changing its impedance to compensate for fluctuations in the plasma chamber impedance. The variable RF match circuit and its feedback control circuit to maintain a low VSWR are essential for three reasons: (1) It provides a constant load impedance to the output stage of the RF generator, so that the generator will supply a constant RF power level to the plasma chamber. Fluctuations in the RF power level would cause instability and unpredictability in the semiconductor processing performed by the plasma chamber. (2) It avoids the high peak voltages associated with a high VSWR on the transmission line 14, which high voltages could damage the transmission line. (3) It avoids the high peak currents associated with a high VSWR on the transmission line, which currents could cause overheating of the transmission line which could change its characteristic impedance, thereby causing nonuniform chamber process conditions depending on the temperature history of the transmission line.

One problem with the system of FIG. 1 is that the variable RF match circuit 16 is expensive and bulky. Furthermore, variable RF match networks which employ moving parts tend to be unreliable. However, at the high RF power levels of 1200 Watts required for chemical vapor deposition processes or 2000 Watts required for etch or chamber cleaning operations, the variable RF match network 14 has seemed indispensable at high RF frequencies on the order of 13.56 MHz.

Referring to FIG. 1B, a low frequency (e.g., 350 kHz) RF generator 12' has a low frequency power circuit 12a' in lieu of the high frequency power circuit 12a of FIG. 1A. The low frequency RF generator 12' is coupled through a fixed RF match network 30 to the plasma chamber 10. Because the RF frequency is so low, the transmission line between the RF generator and the plasma chamber generally is much shorter than a quarter wavelength, so that no standing wave pattern occurs in the transmission line. Therefore the above-mentioned problems (2) and (3) of excessive peak voltages and peak currents will not occur even if there is a mismatch between the plasma chamber impedance and the transmission line.

However, item (1), the effect of plasma chamber load impedance changes on RF power source output level, still must be addressed. In one known low frequency (350 kHz) RF generator design shown in FIG. 1B, a control circuit 32 dynamically adjusts the power level of the RF power circuit 12a to maintain the delivered RF power (i.e., the difference between the forward power 18a and reflected power 18b) at a constant level. Since this control circuit makes the RF power level independent of moderate changes in load impedance, this design omits the variable RF match circuit and its feedback control circuit 20, and substitutes a fixed RF match network 30. The fixed RF match network 30 has a fixed output impedance which is selected to match the average impedance of the plasma inside the chamber 10 over time. Since the plasma impedance will necessarily fluctuate, there will be RF mismatching and loss of RF power due to power reflection back to the RF generator 12. This contrasts with the approach of FIG. 1A in which the power level of the RF circuit 12a is maintained at a constant level and fluctuations in the plasma impedance are compensated by changing the impedance of the variable match circuit 16 to minimize the reflected RF power.

Since the transmission line 14 is short compared to a quarter wavelength, it does not matter which end of the transmission line the match network is connected to, so for convenience the fixed RF match circuit 30 can be included as a component within the RF power generator 12'.

The control circuit 32 includes a first subtractor node 34 which senses delivered RF power (i.e., the difference between the forward power and reflected power outputs 18a, 18b of the dual directional coupler 12c) and a second subtractor node 36 which senses the difference between the delivered RF power and a desired RF power set by the user. (In the diagram of FIG. 2, the desired power level is depicted as a variable analog power source 38 applied to one input of the subtractor node 36, although the source 38 may be digital and the comparison may be carried out digitally by the subtraction node 36.) The output of the second subtractor node is applied as an error signal to a control input of the RF power circuit 12a. The RF power circuit 12a responds to the error signal by either increasing or decreasing the output power level, depending upon the sign of the error signal. This servos the power output level of the RF power circuit 12a to minimize or null the error signal so that the delivered power is maintained at the desired power level. The error signal applied to the control input of the RF power circuit 12a is zero in the absence of fluctuations in the plasma impedance.

The low frequency RF plasma system of FIG. 1B advantageously avoids the need for an expensive, potentially unreliable, variable RF match circuit. However, it has not seemed possible to avoid the use of a variable RF match circuit at higher RF frequencies, such as the commonly used frequency of 13.56 MHz.

SUMMARY OF THE INVENTION

An apparatus for plasma processing of semiconductor wafers or substrates allows the use of a fixed RF match circuit at high RF frequencies by locating the RF power source at a distance substantially less than an eighth of a wavelength from the coupling device, such as an electrode or antenna, which couples the RF power into a plasma chamber. Preferably, the RF power source and fixed match circuit are mounted directly on the plasma chamber to minimize such distance. The apparatus includes a control circuit for maintaining a constant level of delivered power notwithstanding changes in the impedance of the plasma chamber.

Optionally, the invention also includes apparatus for detecting the endpoint of an etch or cleaning process by detecting when the reflected power or VSWR ceases to change as a function of the removal of the substance being etched or cleaned.

DETAILED DESCRIPTION OF THE PREFERRED EMBODIMENTS

Plasma Excitation Circuit with Fixed RF Match

The present invention may be used with any plasma chamber for processing semiconductor wafers or substrates, such as plasma etch chambers and plasma-enhanced deposition chambers. The chamber may using any conventional device for electrically coupling RF power into the chamber, such as electrodes for capacitive coupling, a coil for inductive coupling, or an antenna for electromagnetic coupling of RF power into the chamber.

Figure 1A:
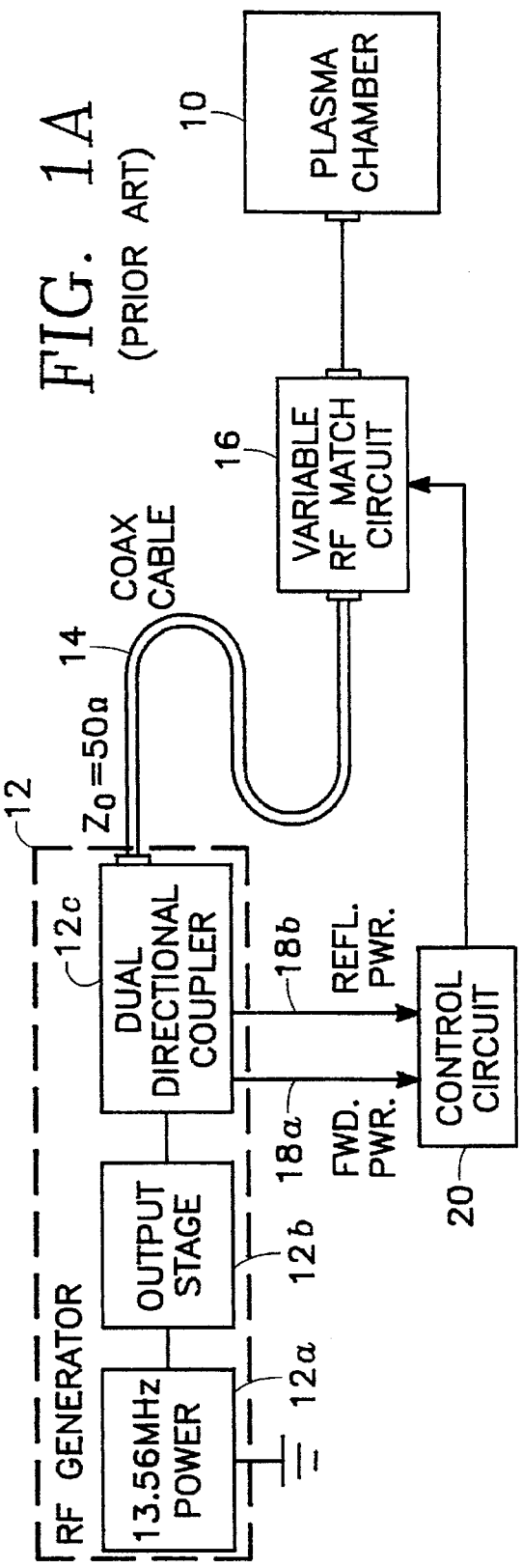
FIG. 1A is a simplified block diagram of a high frequency plasma reactor and RF control system of the prior art.
Figure 1B:
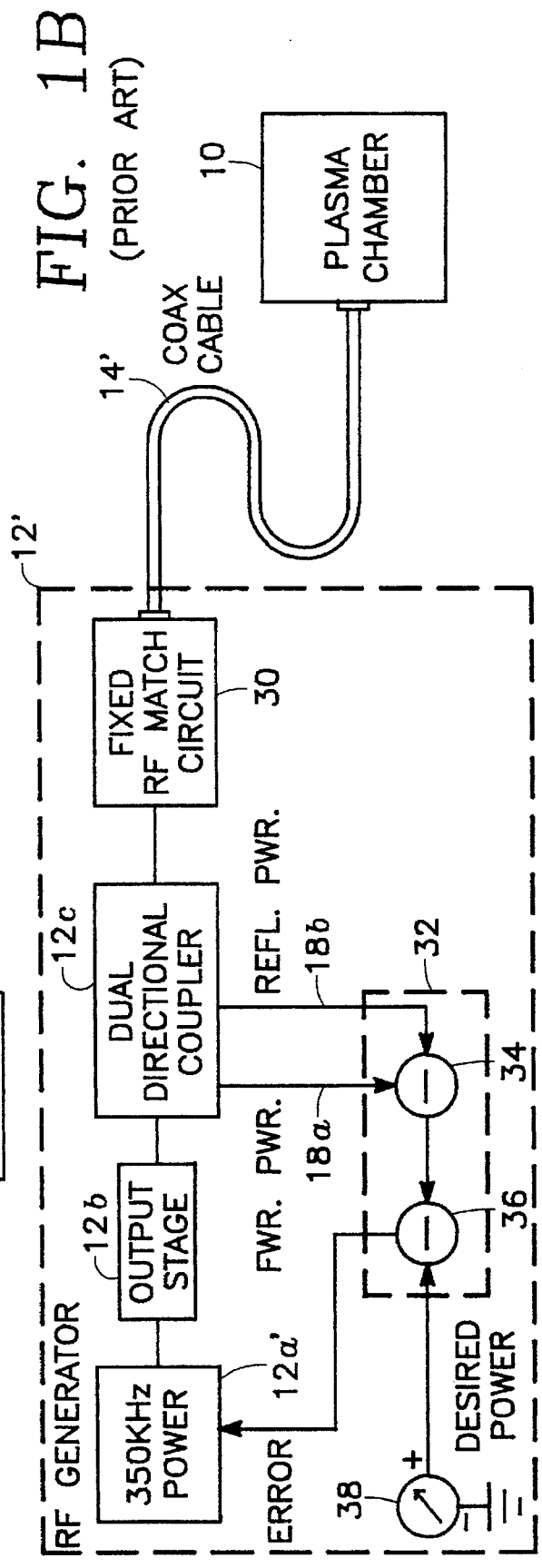
FIG. 1B is a simplified block diagram of a low frequency plasma reactor and RF control system of the prior art.
Figure 2:
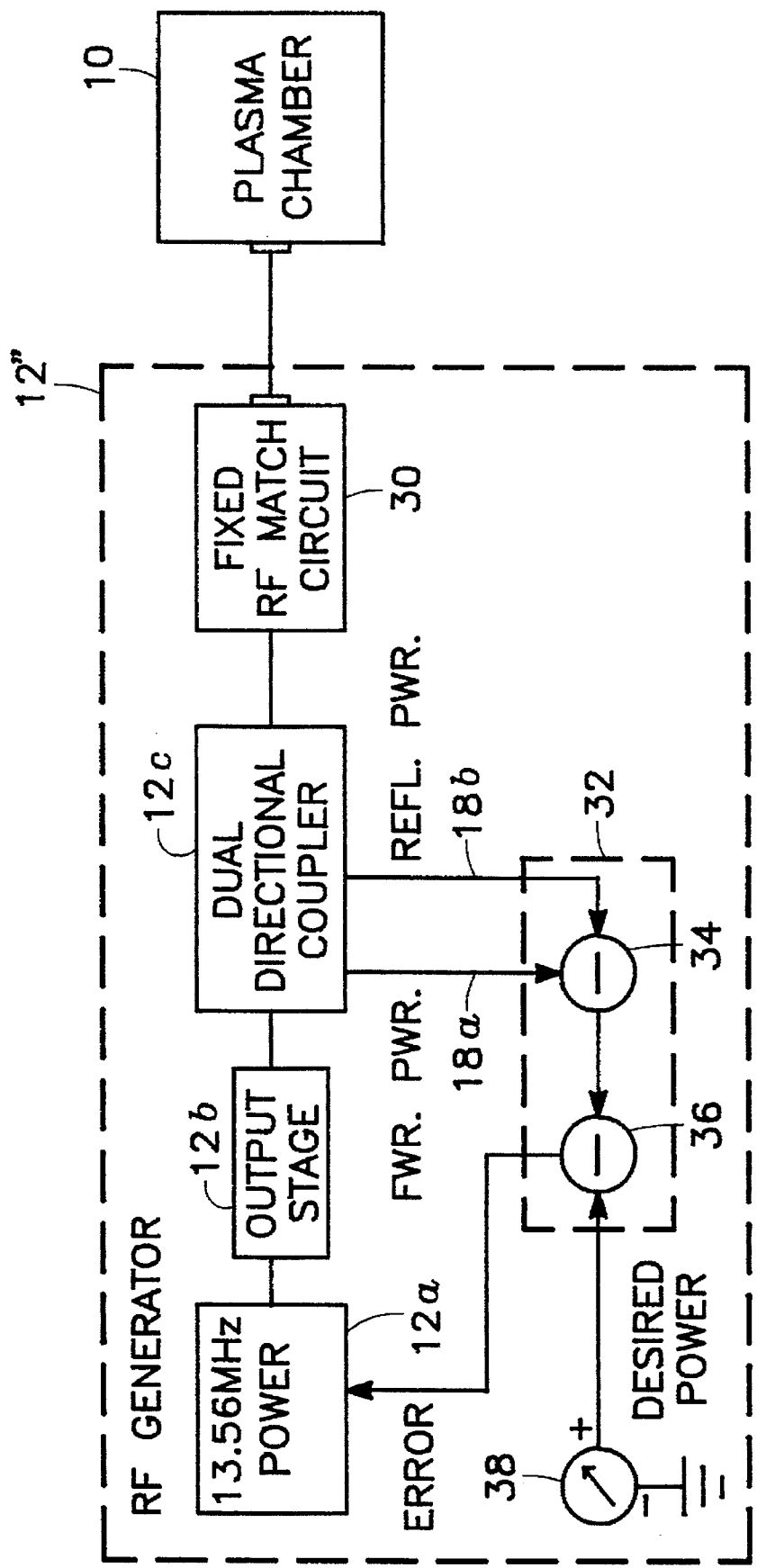
FIG. 2 is a block diagram of a plasma reactor and RF control system of a first embodiment of the invention.

Referring to FIG. 2, the invention employs a novel high frequency RF generator 12" having the same topology as the prior art low frequency RF generator 12' of FIG. 1B. A high frequency is considered a frequency of at least 1 MHz. Like the prior art low frequency generator, but unlike the prior art high frequency RF generator, our design uses a fixed RF match and includes a control circuit 32 which maintains delivered RF power at a desired level. Our design has a high frequency power source 12a in lieu of the low frequency power source 12' of FIG. 1B.

Importantly, our design avoids the need for a variable RF match circuit by locating the RF generator a very short distance from the electrode, inductor, antenna, or other RF coupling device in the plasma chamber 10 to which the RF power is being delivered, specifically, a distance which is much less than an eighth of a wavelength at the frequency of the RF generator. At a typical high RF frequency of 13 MHz, the RF signal has a wavelength in a typical coaxial transmission line of about 15 meters, so that an eighth of a wavelength would be about 2 meters. Preferably, the RF generator 12" is mounted directly on the plasma chamber 10 so that there is negligible distance separating the two components. The elimination of a long transmission line between the RF generator and the plasma chamber allows us to substitute a relatively inexpensive, compact, and reliable fixed RF match circuit 30 in place of the much more expensive and often less reliable variable RF match circuit 16 used in conventional high frequency RF power systems.

The use of a fixed RF match means the RF generator will experience all fluctuations in the load impedance of the plasma chamber. The controller 32 maintains a constant delivered power (forward power minus reflected power) in spite of changes in the plasma chamber load impedance during processes performed within the chamber.

The principles for designing an RF match circuit to match the output impedance of an RF generator to the impedance of a load are well known. The RF match contains inductors (L) and/or capacitors (C) whose values are chosen according to straightforward design equations to match given input and output impedances at a given frequency. For example, the design equations are described in the following reference books, the complete contents of which are hereby incorporated by reference into this patent application: "Reflections—Transmission Lines and Antennas" by Walter Maxwell (1990); and "Radio Frequency Transistors-Principles and Practical Applications" by Norm Dye and Helge Granberg (1993).

The RF match circuit should be optimized to maintain the VSWR, caused by the impedance mismatch between the output impedance of the RF generator and the impedance of the plasma reactor load, below a value at which the RF generator can safely supply the required delivered power. Most RF generators can tolerate a higher VSWR when operating below their rated maximum output power. Therefore, the RF match L and C component values should be chosen to provide a relatively low VSWR during the plasma processes that require the highest RF power.

Figure 3:
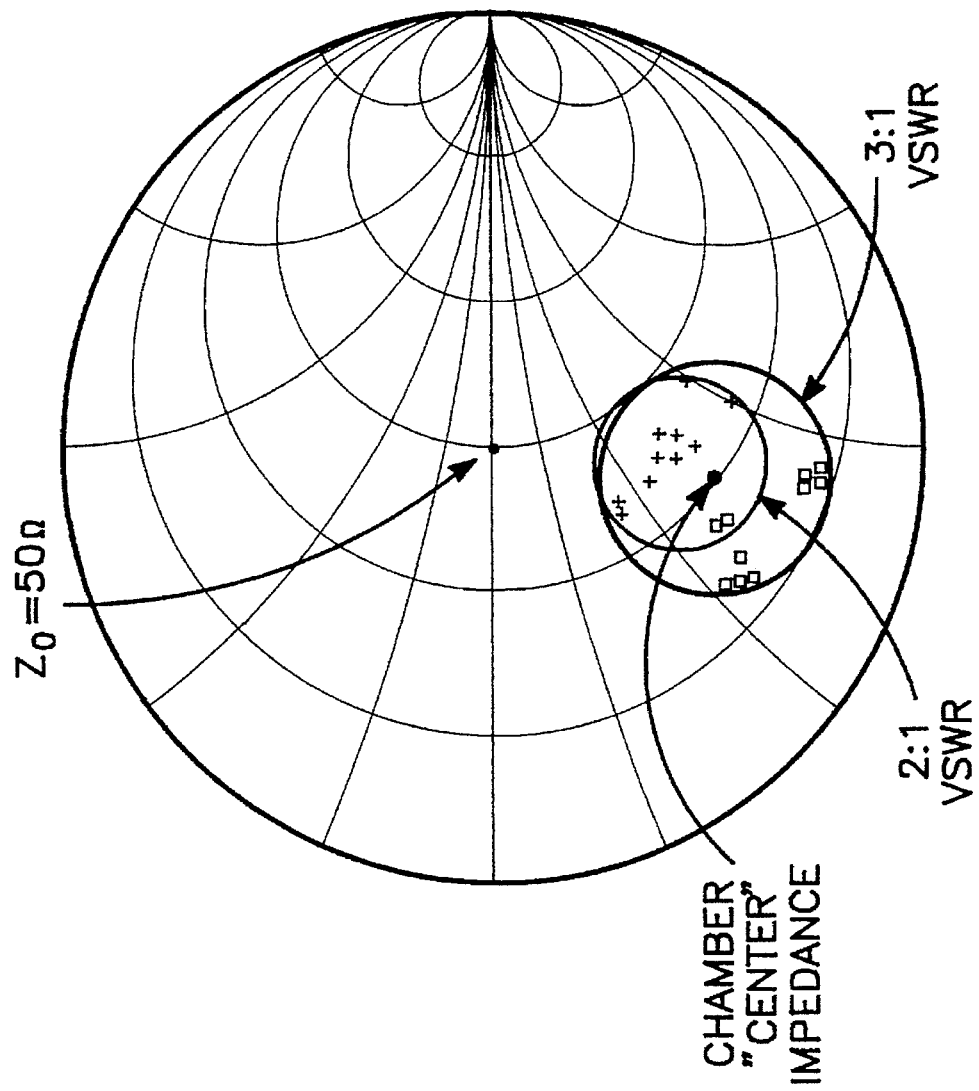
FIG. 3 is a Smith chart corresponding to the embodiment of FIG. 2.

The Smith chart of FIG. 3 illustrates the method used to optimize the RF match circuit 30 in our invention. The small squares on the chart represent the load impedance of the plasma chamber during different phases of a typical plasma-enhanced chemical vapor deposition (PECVD) process performed within the chamber. The small crosses on the chart represent the chamber load impedance during different phases of a typical plasma etch process used to clean the chamber between PECVD processes. The exemplary CVD process requires 1200 watts of RF power, and the etch process requires 2000 watts of RF power, both at a frequency of 13.56 MHz. The commercially available RF generator used in our example can deliver 2000 watts to a load if the VSWR is 2 or less, and can deliver 1200 watts if the VSWR is 3 or less. If the L and C components of the RF match are chosen to match the 50 ohm RF generator output impedance to the chamber "center" impedance indicated by the large dot in FIG. 3, then all the crosses fall within the VSWR=2 circle, and all the squares fall within the VSWR=3 circle. Therefore, designing the RF match to this "center" impedance accomplishes our objectives.

The power level regulator circuit in the design shown in FIG. 2 is identical to the regulator circuit of the prior art system shown in FIG. 1B. A conventional 50 ohm dual directional coupler 12c provides the requisite measurements of forward and reflected power 18a, 18b to a control circuit 32. The a first comparator or subtractor circuit 34 determines the power delivered to the load (the plasma chamber) by subtracting the rectified and low pass filtered forward power signal 18a from the reflected power signal 18b. A second comparator or subtractor circuit 36 compares the delivered power level as so determined with a value 38 representing the desired delivered power. The second comparator adjusts a control sent to the power source 12a according to whether the delivered power is too high or too low. The circuitry described may be implemented by conventional, straightforward techniques in analog or digital form, or by programming a general purpose microcomputer.

A variation on the design shown in FIG. 2 would be to simplify the RF generator by eliminating the output stage 12b which converts the output impedance of the RF power source 12a to the 50 ohm industry standard impedance. The L and C components of the fixed RF match circuit then would be chosen according to well known design equations to match the non-standard output impedance of the RF power source instead of matching 50 ohms. The complication presented by this variation is that the dual directional coupler also would have to be designed for this non-standard impedance. Dual directional coupler design principles also are extremely well known, so designing one for a non-standard impedance presents no conceptual difficulty, but it precludes using an "off the shelf" 50 ohm dual directional coupler.

Figure 4:
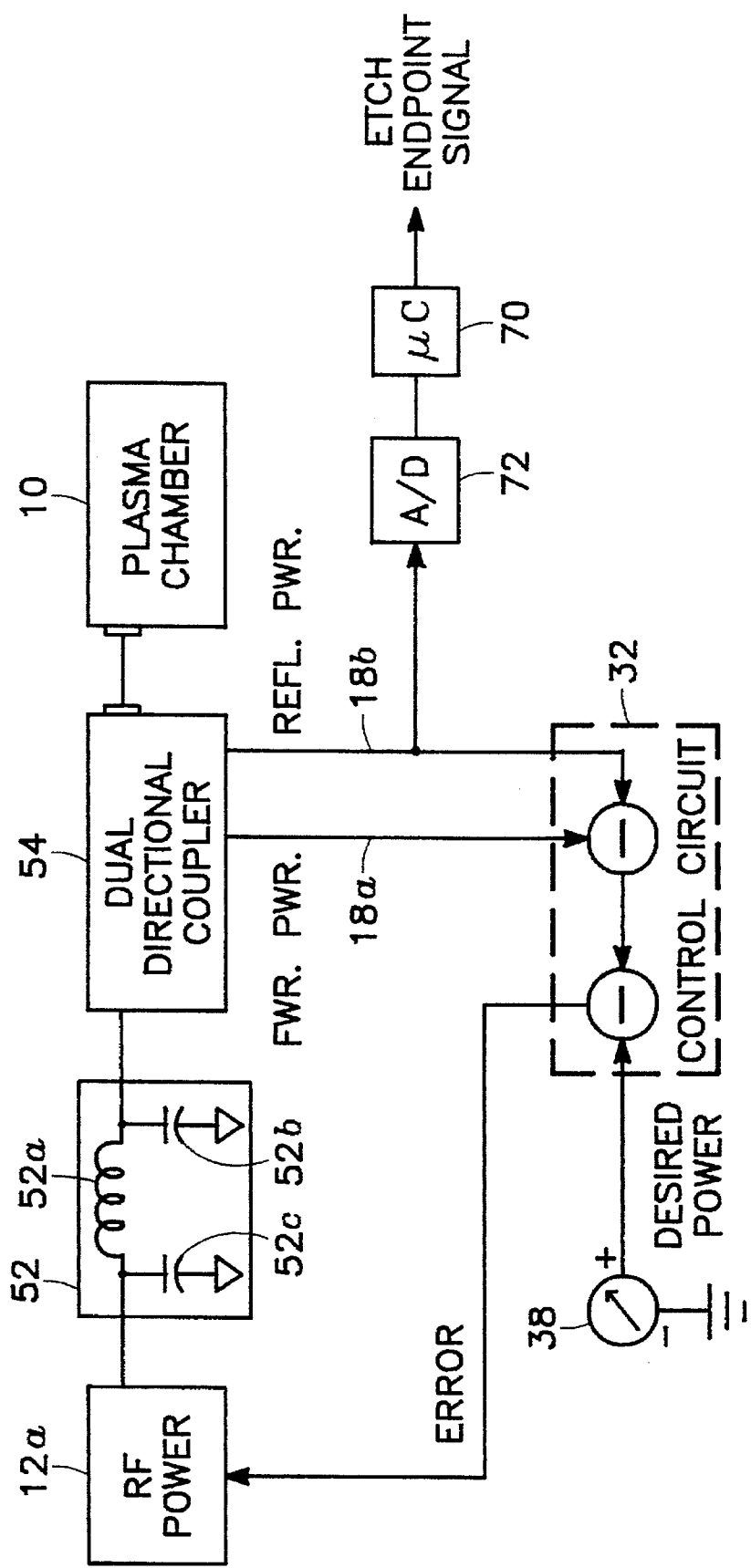
FIG. 4 is a block diagram of a plasma reactor and RF control system of a second embodiment of the invention.

FIG. 4 illustrates a further variation of the invention in which the output stage 12b is eliminated as just described, and furthermore the respective positions within the topology of the RF generator circuit 12 of the dual directional coupler and the RF match are swapped. An advantage of the embodiment of FIG. 4 is that the measurements of forward and reflected power provided by the dual directional coupler 54 more accurately indicate the actual power delivered to the plasma chamber.

In the previously described embodiments in which the fixed RF match network 30 is located between the dual directional coupler 12c and the reactor chamber 10 as shown in FIG. 2, the dual directional coupler is measuring the total power delivered to the match network 30 and the plasma chamber 10. However, five to ten percent of the delivered power typically will be dissipated in the match network 52; consequently, the power actually delivered to the plasma chamber will be 90–95% of the power indicated by the dual directional coupler as being delivered. The amount of power will vary within this range as the impedance presented by the plasma chamber varies under different plasma process conditions. Therefore, there may be up to a 5% unpredictability in the RF power delivered to the chamber.

By locating the dual directional coupler 12c between the match network 52 and the chamber as shown in FIG. 4, the coupler 12c will measure the power actually delivered to the plasma chamber. Therefore, the power delivered to the chamber will be more accurately controlled by the control circuit 32, thereby permitting more uniform and predictable processing of the semiconductor substrate in the chamber.

In the FIG. 4 embodiment, because there is no RF match circuit between the dual directional coupler and the plasma chamber, the dual directional coupler 54 must be designed to operate at the load impedance of the plasma reactor rather than the output impedance of the RF power source.

Process Endpoint Detection

As described above, the control circuits of the embodiments of FIGS. 2 and 4 permit the VSWR, and hence the reflected power, to fluctuate rather than attempting to null the reflected power in response to fluctuations in the plasma impedance. In accordance with another aspect of the invention, this feature is exploited during etching or chamber cleaning operations to determine when the substance being etched has been completely removed, or when the chamber has been thoroughly cleaned, so that the etching or cleaning process may be terminated.

In a conventional process for cleaning a deposition chamber, any production wafer is removed from the chamber, and then a strong etchant gas is introduced into the chamber while a high level of RF power is applied to the chamber to excite the etchant gas into a plasma state. As a result, various unwanted deposits are removed from the chamber side walls and pedestal. If for example the reactor is normally used to perform chemical vapor deposition of silicon nitride on production wafers, then silicon nitride deposits accumulate over many deposition cycles to the extent that they interfere with the chemical vapor deposition process during subsequent production cycles and must be removed before the reactor can be used again.

However, the length of time that the chamber cleaning step must be performed to remove all unwanted deposits is difficult to determine, and so it is customary to perform the cleaning step for an excessive amount of time to guarantee removal of all deposits. Unfortunately, after the unwanted deposits are removed, continuing the chamber cleaning process will etch any exposed metal components within the chamber interior, such as the aluminum chamber walls, the aluminum gas inlet, and the aluminum wafer support pedestal. This etching eventually damages the chamber components to the point where they must be replaced. Therefore, the life of the chamber components could be extended if the etching could be stopped as soon as all the unwanted deposits were removed.

Our solution to this problem is to sense the change in plasma chamber load impedance during the chamber cleaning operation. Such a change in plasma impedance indicates the removal of deposits from the chamber interior surfaces, because the thickness of deposits on the chamber walls affects the impedance between the metal chamber components and the plasma body. Specifically, our endpoint detection design senses changes in the plasma impedance by sensing changes in the VSWR or the reflected power, as measured by the dual directional coupler 12c (FIG. 2 or 4). Initially during roughly the first ten seconds of a typical chamber cleaning process, there is no perceptible change in the plasma impedance because the incremental amount of deposits being removed represents a relatively small fraction of the total deposits. Then, after the remaining layer of deposits becomes appreciably thinner, the plasma chamber load impedance begins changing noticeably as the layer of deposits continues to diminish. Once all deposits or contamination have been removed from the chamber interior, the plasma impedance stops changing (or, the rate of change of the plasma impedance falls below a predetermined threshold). Thus, the completion of the chamber cleaning operation is signaled by the reflected RF power reaching a constant level (or by a reduction in the rate of change of the reflected power below the predetermined threshold). At this time, the chamber cleaning process may be halted.

For this purpose, an alarm signal to halt the chamber cleaning operation is generated by a microprocessor 70 shown in FIG. 4. The microprocessor 70 is programmed to wait (during the first ten seconds of the chamber cleaning operation) until the plasma impedance first begins to change. Thereafter, the processor continuously determines whether the reflected RF power is changing at a rate of change exceeding a predetermined threshold rate (which, for example, may be zero). Once the rate of change is below the predetermined threshold for a minimum amount of time (e.g., one second), the alarm signal indicating completion of the chamber cleaning operation is transmitted. In one embodiment, the microprocessor 70 has an input port coupled through an analog-to-digital converter 72 to the reflected power output signal 18b from the dual directional coupler 54. The microprocessor 70 samples the reflected power signal periodically and compares it with the value sampled during the previous processing cycle. If the difference falls below a predetermined value for a predetermined number of processing cycles, then the microprocessor 70 outputs a signal indicating to the user that the chamber cleaning operation is complete and should be halted to avoid excess wear on the chamber interior surfaces. Either the user must halt the chamber cleaning operation or else this signal may be employed to automatically halt the chamber cleaning operation as well as signalling the user. While a digital device (the microprocessor 70 and analog-to-digital converter 72) has been disclosed as providing the "completion-of-chamber clean" signal, the microprocessor 70 may be replaced by a dedicated logic circuit or else an analog circuit.

The same endpoint detection process also can be used in a plasma etch chamber to detect when a film being etched from a semiconductor substrate has been completely removed.

The RF excitation circuit having a fixed RF match network can be use equally well with any means for coupling RF power to a plasma, such as a pair of electrodes for capacitively coupling power to the plasma, or an inductor or antenna for inductively coupling power to the plasma. Numerous designs for such power coupling devices are known in the art.

While the invention has been described in detail by specific reference to preferred embodiments, it is understood that variations and modifications thereof may be made without departing from the true spirit and scope of the invention.

What is claimed is:

1. A high frequency RF plasma system for processing a semiconductor substrate, comprising:
    a plasma chamber adapted to receive a semiconductor substrate and a process gas therein;
    a coupling device for coupling RF energy to the process gas inside the chamber;
    an RF power generator mounted adjacent to the plasma chamber, including
        an RF power source for producing RF energy having a frequency of at least 1 MHz, the power source having an output located at a distance from the coupling device of substantially less than an eighth of a wavelength at said frequency;
        a fixed RF impedance matching circuit, having a fixed impedance, connected between the RF power source and the coupling device;
        a power sensing coupler connected in series with the match circuit between the RF power source and the coupling device, said power sensing coupler having a measurement output indicating the amount of RF power delivered through the coupler; and
        a control circuit coupled to said measurement output of said power sensing coupler and connected to said RF power circuit to govern the amount of RF power produced by said RF power circuit so as to maintain the delivered power measured by the coupler at a predetermined level.

2. The reactor system of claim 1 wherein said power sensing coupler comprises a dual directional coupler whose measurement output includes
    a forward signal output indicating the amount of power transmitted forward through the coupler, and
    a reflected signal output indicating the amount of power reflected back through the coupler,
    so that the difference between the forward and reflected signal outputs indicates the amount of RF power delivered through the coupler.

3. The reactor system of claim 1 wherein said power sensing coupler is connected in series between the power source and the matching circuit, whereby the measurement output of the coupler indicates the total RF power delivered to the matching circuit and the chamber.

4. The reactor system of claim 1 wherein said power sensing coupler is connected in series between the matching circuit and the chamber, whereby the measurement output of the coupler indicates the RF power delivered the the chamber.

5. The reactor system of claim 3 further comprising an output stage connected between said RF power circuit and said dual directional coupler, said RF power circuit, said output stage and said dual directional coupler being within an RF generator, said fixed RF match circuit being mounted directly on said RF generator.

6. The reactor system of claim 5 wherein said output stage provides a predetermined output impedance and wherein said fixed RF match circuit has a reactance providing an RF match between said predetermined output impedance and an expected load impedance lying in a range of load impedances presented by a plasma in said reactor chamber.

7. The reactor system of claim 4 wherein said fixed RF match circuit has a reactance providing an RF match between an output impedance of said RF power circuit and an expected load impedance lying in a range of load impedances presented by a plasma in said reactor chamber.

8. The reactor system of claim 1 further comprising a sensor connected to said control circuit for sensing during a chamber cleaning operation whether said power reflected back has reached a stable level, indicative of a complete removal of contamination from said reactor chamber.

9. A plasma reactor system, comprising:
    an RF plasma chamber including an RF coupling device for coupling RF power into the chamber;
    a high frequency RF power source on said RF plasma chamber, comprising:
        an RF power circuit providing an RF signal of a high frequency greater than 1 MHz;
        a fixed RF match circuit cablelessly connected between said RF power circuit and said RF coupling device; and
        sensing and control means for sensing the amount of RF power delivered by said RF power source and for regulating the output power level of said RF power circuit so as to maintain said RF power delivered at a desired level.

10. The plasma reactor system of claim 9 wherein said high frequency is on the order of about 13 MHz.

11. The plasma reactor system of claim 9 wherein said sensing and control means comprises:
    means for sensing forward power and reflected power at said fixed RF match circuit;
    means for computing delivered RF power as a difference between said forward power and reflected power;

means for comparing said delivered RF power to a desired power level to produce an error signal and for changing the power produced by said RF power source so as to null said error signal.

12. The plasma reactor system of claim 11 wherein said means for sensing is connected to an RF input of said fixed RF match circuit.

13. The plasma reactor system of claim 11 wherein said means for sensing is connected to an RF output of said fixed RF match circuit.

14. The plasma reactor of claim 9 wherein said fixed RF match circuit provides an approximate RF match between an output impedance of said RF power source and a nominal impedance encountered at said RF radiator of said reactor chamber.

15. The plasma reactor of claim 14 wherein said nominal impedance is a load impedance presented by a plasma within said reactor chamber and lies in a range of load impedances presented by said plasma under different operating conditions of said reactor chamber.

16. The plasma reactor of claim 15 wherein said range corresponds to a voltage standing wave ratio between forward and reflected power not exceeding about 3:1.

17. The reactor system of claim 11 further comprising a sensor connected to said control circuit for sensing during a chamber cleaning operation whether said power reflected back has reached a stable level, indicative of a complete removal of contamination from said reactor chamber.

* * * * *